(12) United States Patent
Yamada (10) Patent No.: US 7,432,451 B2
(45) Date of Patent: Oct. 7, 2008

(54) ELECTRO-OPTICAL DEVICE, CIRCUIT BOARD, MOUNTING STRUCTURE, AND ELECTRONIC APPARATUS

(75) Inventor: Kazuyuki Yamada, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 192 days.

(21) Appl. No.: 11/337,470

(22) Filed: Jan. 24, 2006

(65) Prior Publication Data

US 2006/0164586 A1 Jul. 27, 2006

(30) Foreign Application Priority Data

Jan. 24, 2005 (JP) ............................. 2005-015449
Jan. 18, 2006 (JP) ............................. 2006-009991

(51) Int. Cl.
*H05K 1/16* (2006.01)

(52) U.S. Cl. ...................................... 174/260; 174/254

(58) Field of Classification Search ................. 174/254, 174/260, 261, 262; 349/149, 150
See application file for complete search history.

(56) References Cited

U.S. PATENT DOCUMENTS

| | | | |
|---|---|---|---|
| 5,436,744 A | * | 7/1995 | Arledge et al. ............... 349/150 |
| 5,668,700 A | | 9/1997 | Tagusa et al. |
| 6,169,530 B1 | * | 1/2001 | Mori et al. ...................... 345/93 |
| 6,319,019 B1 | * | 11/2001 | Kwon et al. ................... 439/67 |
| 6,399,892 B1 | * | 6/2002 | Milkovich et al. ........... 174/258 |
| 6,639,155 B1 | * | 10/2003 | Bupp et al. ................... 174/260 |

FOREIGN PATENT DOCUMENTS

| | | |
|---|---|---|
| JP | A-08-045986 | 2/1996 |
| JP | 2001-284751 | 10/2001 |

* cited by examiner

*Primary Examiner*—Ishwar (I. B.) Patel
(74) *Attorney, Agent, or Firm*—Oliff & Berridge, PLC (57) ABSTRACT

An electro-optical device including an electro-optical panel, a flexible base member connected to the electro-optical panel, and an electronic component mounted on the flexible base member. The electronic component having conductive terminals electrically connected to a plurality of terminals disposed on the flexible base member, the plurality of terminals are disposed on one surface of the flexible base member, and the conductive terminals and the plurality of terminals two-dimensionally overlap each other. The flexible base member has first wires which are connected to the plurality of terminals and disposed on the one surface, hole portions formed in the flexible base member to correspond to at least one terminal, and second wires connected to the at least one terminal through connection members disposed in the hole portions and disposed on the other surface of the flexible base member opposite to the one surface.

3 Claims, 11 Drawing Sheets

ELECTRO-OPTICAL DEVICE, CIRCUIT BOARD, MOUNTING STRUCTURE, AND ELECTRONIC APPARATUS

BACKGROUND

1. Technical Field

The present invention relates to an electronic apparatus such as a personal computer or a mobile phone and an electro-optical device, a mounting structure, and a substrate for the electro-optical device which are used for the electronic apparatus.

2. Related Art

In the past, electro-optical devices such as liquid crystal devices were used as display units of electronic apparatuses such as personal computers and mobile phones. The liquid crystal device include a liquid crystal panel in which a liquid crystal is enclosed between two substrates opposed to each other and a flexible base member mounted with electronic components such as semiconductor elements is connected to one substrate thereof. Wires connected to semiconductor chips are disposed on one surface of the flexible base member. For example, when the flexible base member is warped for use, slits are formed in the warped portion of the flexible base member so as to facilitate the warping. Accordingly, the length of the flexible base member increases corresponding to the slits.

In order to solve the above-mentioned problem, a technique of reducing the thickness of the flexible base member so as to facilitate the warping and not forming the slits so as to accomplish decrease in size corresponding to the slits has been disclosed in JP-A-2001-284751 (for example, see paragraph [0022] and FIG. 1 in JP-A-2001-284751).

However, the technique disclosed in JP-A-2001-284751 has a problem that the wires disposed on the flexible base member are warped when the flexible base member is warped and the wires are disconnected in the vicinity of the warped portion, specifically, in the vicinity of electronic components, thereby deteriorating reliability in connection between the electronic components such as semiconductor elements and the wires.

In addition, an unintended warping stress can be applied to the flexible base member, for example, in an inspection process. As a result, a tension is applied to the wires disposed on one surface of the flexible base member and specifically the wires in the vicinity of the electronic components can be disconnected.

SUMMARY

An advantage of some aspects of the invention is to provide an electro-optical device, a substrate for an electro-optical device, and a mounting structure, which are all excellent in electrical reliability of wires in the vicinity of electronic components, and an electronic apparatus having the electro-optical device.

According to an aspect of the invention, there is provided an electro-optical device comprising an electro-optical panel, a flexible base member connected to the electro-optical panel, and an electronic component mounted on the flexible base member. Here, the electronic component has conductive terminals electrically connected to a plurality of terminals disposed on the flexible base member, the plurality of terminals are disposed on one surface of the flexible base member, and the conductive terminals and the plurality of terminals two-dimensionally overlap with each other. The flexible base member has first wires which are connected to the plurality of terminals and disposed on the one surface thereof, hole portions formed in the flexible base member to correspond to at least one terminal of the plurality of terminals, and second wires which are connected to the at least one terminals through connection members disposed in the hole portions and are disposed on the other surface of the flexible base member opposite to the one surface. The hole portions two-dimensionally overlap with the conductive terminals and the plurality of terminals.

According to another aspect of the invention, there is provided an electro-optical device comprising an electro-optical panel, a flexible base member connected to the electro-optical panel, and an electronic component mounted on the flexible base member. Here, the electronic component has solder balls electrically connected to a plurality of terminals disposed on the flexible base member, the plurality of terminals are disposed on one surface of the flexible base member, and the solder balls and the plurality of terminals two-dimensionally overlap with each other. The flexible base member has first wires which are connected to the plurality of terminals and disposed on the one surface thereof, hole portions formed in the flexible base member to correspond to at least one terminal of the plurality of terminals, and second wires which are connected to the at least one terminals through connection members disposed in the hole portions and are disposed on the other surface of the flexible base member opposite to the one surface. The hole portions two-dimensionally overlap with the solder balls and the plurality of terminals.

In the invention described above, even when an unintended warping stress acts on the flexible base member in the vicinity of the electronic component in an inspection process and a tension acts on the first wires in the vicinity of the electronic component opposite to the curvature center side to disconnect the wires, the second wires at the curvature center side can maintain the connection to the terminals, thereby securing electrical reliability of the wires. In addition, since it is not necessary to form holes at positions other than the terminals on the flexible base member as in the related art in order to electrically connect the terminals on the one surface of the flexible base member to the second wires on the opposite surface, it is possible to accomplish save of space.

According to an embodiment of the invention, the plurality of terminals may be disposed in a lattice shape and at least one terminal is disposed at the corners of the lattice shape. Accordingly, since the plurality of terminals are disposed in a lattice shape and at least one terminal is disposed at the corners of the lattice shape, even when the corners of the flexible base member are warped due to an external force acting on the flexible base member at the time of inspecting the flexible base member and thus a tension acts on the first wires or the second wires connected to the terminals disposed at the corners of the lattice shape to disconnect the wires, it is possible to secure the electrical connection by the use of any other wires. Accordingly, it is possible to improve the electrical reliability of the wires connected to the terminals at the corners of the lattice shape in which the disconnection could easily occur due to a large force acting thereon.

According to another embodiment of the invention, the second wires may be connected to all the plurality of terminals through the connection members. Accordingly, since the second wires are connected to all the plurality of terminals through the connection members, it is possible to prevent the disconnection of the first wires or the second wires connected to the terminals other than the corner terminals, as well as to prevent the disconnection of the wires connected to the corner terminals of the lattice shape in which the disconnection can easily occur due to the warping of the flexible base member, thereby securing the electrical reliability.

According to another embodiment of the present invention, a drawing-out direction of the first wires from the at least one terminal and a drawing-out direction of the second wires connected to the at least one terminal through the connection members may be different from each other. Accordingly, since a drawing-out direction of the first wires from the at least one terminal and a drawing-out direction of the second wires connected to the at least one terminal through the connection members are different from each other, it is possible to allow different tensions to act on the first wires and the second wires when the flexible base member is bent in the inspection process. For example, the disconnection of the second wires can be prevented, thereby securing the electrical reliability of the wires.

According to another embodiment of the invention, a drawing-out direction of the first wires from the at least one terminal and a drawing-out direction of the second wires connected to the at least one terminal through the connection members may be perpendicular to each other. Accordingly, since a drawing-out direction of the first wires from the at least one terminal and a drawing-out direction of the second wires connected to the at least one terminal through the connection members are perpendicular to each other, it is possible to more surely allow different tensions to act on the first wires and the second wires, in comparison with the case that the first wires and the second wires are lead in the different directions but in the almost same directions, when the flexible base member is bent in the inspection process. For example, the disconnection of the second wires can be prevented, thereby securing the electrical reliability of the wires.

According to another embodiment of the invention, the first wires connected to the at least one terminal and the second wires connected to the at least one terminal through the connection members may be drawn out in the same direction and may be led in a different direction in the way. Accordingly, since the first wires connected to the at least one terminal and the second wires connected to the at least one terminal through the connection members are drawn out in the same direction and are led in a different direction in the way, it is possible to reduce the lengths of the first wires and the second wires to the minimum length by drawing out the first wires and the second wires in the same direction. In addition, by drawing out the first wires and the second wires in the different directions at the positions where the flexible base member can be easily bent, the force acting on the second wires can be set smaller than the force acting on the first wired, depending upon the positions of the flexible base member and thus the disconnection of the second wires can be prevented, thereby securing the electrical reliability.

According to another aspect of the invention, there is provided a substrate for an electro-optical device comprising a flexible base member and terminals connected to conductive terminals of an electronic component mounted on the flexible base member. Here, the terminals are disposed on one surface of the flexible base member to two-dimensionally overlap with the conductive terminals. The flexible base member has first wires which are connected to the terminals and disposed on the one surface thereof, hole portions formed in the flexible base member to correspond to the terminals, and second wires which are connected to the terminals through connection members disposed in the hole portions and are disposed on the other surface of the flexible base member opposite to the one surface. The hole portions two-dimensionally overlap with the terminals.

According to another aspect of the invention, there is provided a circuit board comprising a flexible base member and terminals connected to conductive terminals of an electronic component mounted on the flexible base member. Here, the terminals are disposed on one surface of the flexible base member to two-dimensionally overlap with the conductive terminals. The flexible base member has first wires which are connected to the terminals and disposed on the one surface thereof, hole portions formed in the flexible base member to correspond to the terminals, and second wires which are connected to the terminals through connection members disposed in the hole portions and are disposed on the other surface of the flexible base member opposite to the one surface. The hole portions two-dimensionally overlap with the terminals.

In the invention described above, even when the flexible base member is bent in the vicinity of the terminals and the first wires in the vicinity of the terminals opposite to the curvature center side of the flexible base member are disconnected, the second wires at the curvature center side can maintain the connection to the terminals, thereby securing the reliability in connection to the terminals. In addition, since it is not necessary to form holes at positions other than the terminals on the flexible base member as in the related art in order to electrically connect the terminals on the one surface of the flexible base member to the second wires on the opposite surface, it is possible to save the space.

According to another aspect of the invention, there is provided a mounting structure comprising a flexible base member and an electronic component mounted on the flexible base member. The electronic component has conductive terminals electrically connected to terminals disposed on the flexible base member, the terminals are disposed on one surface of the flexible base member, and the conductive terminals and the terminals two-dimensionally overlap with each other. The flexible base member has first wires which are connected to the terminals and disposed on the one surface thereof, hole portions formed in the flexible base member to correspond to the terminals, and second wires which are connected to the terminals through connection members disposed in the hole portions and are disposed on the other surface of the flexible base member opposite to the one surface. The hole portions two-dimensionally overlap with the conductive terminals and the terminals.

In the invention described above, even when the flexible base member is bent in the vicinity of the electronic component and the first wires in the vicinity of the electronic component opposite to the curvature center side of the flexible base member are disconnected, the second wires at the curvature center side can maintain the connection to the terminals, thereby securing the reliability in connection to the terminals. In addition, since it is not necessary to form holes at positions other than the terminals on the flexible base member as in the related art in order to electrically connect the terminals on the one surface of the flexible base member to the second wires on the opposite surface, it is possible to save the space.

According to another aspect of the invention, there is provided an electronic apparatus comprising the above-mentioned electro-optical device.

In the invention, since an electro-optical device having excellent electrical reliability of wires is employed, it is possible to obtain an electronic apparatus having an excellent display performance.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the present invention will be described with reference to the drawings. In the following description of the embodiments, a liquid crystal device as an electro-optical device, specifically, a transflective active matrix liquid crystal device, and an electronic apparatus employing the liquid crystal device will be explained, but the invention is not limited to them. In the drawings, for the purpose of easy understanding of respective elements, the elements have scales and numbers different from those of actual elements.

First Embodiment

Figure 1:
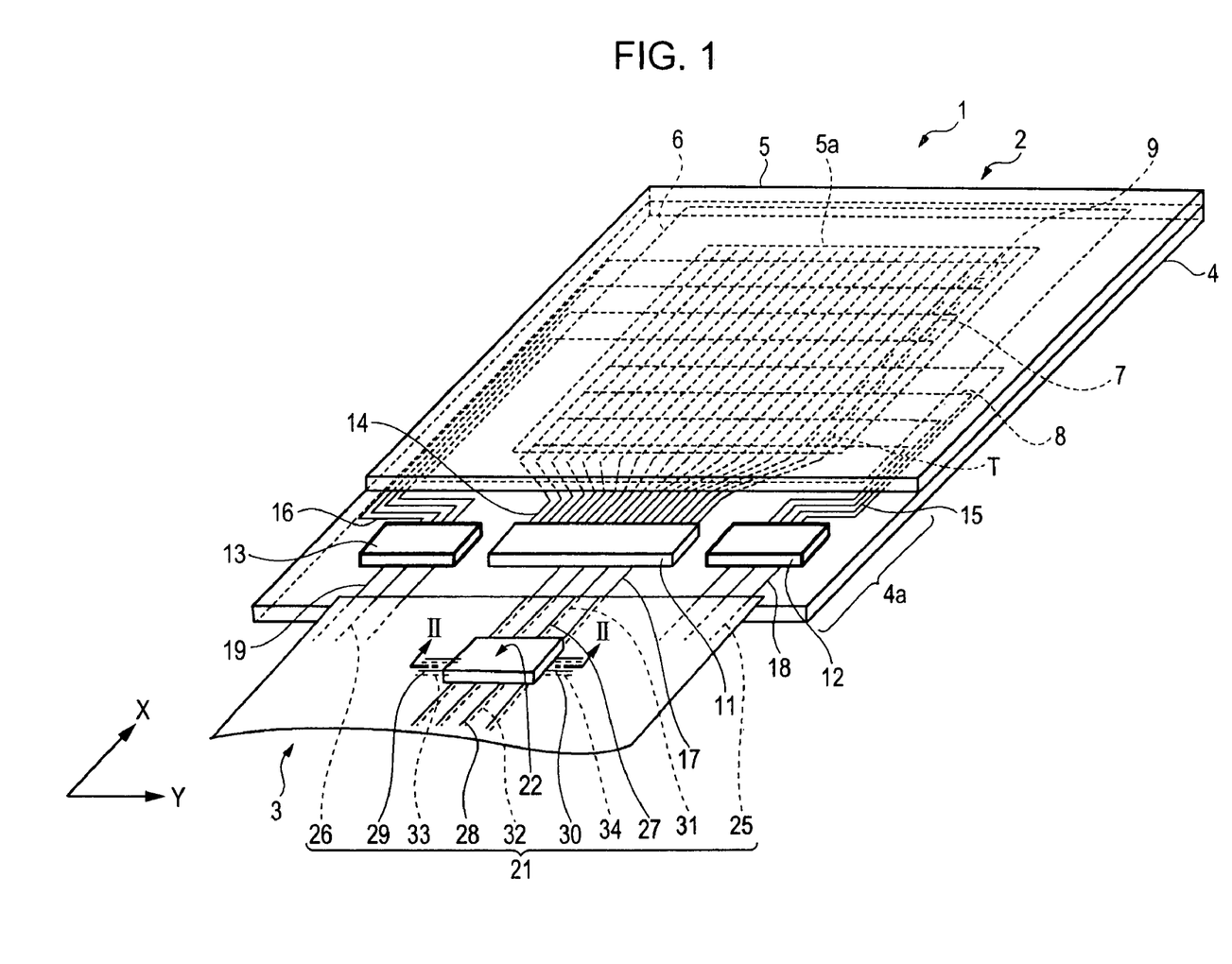
FIG. 1 is a schematic perspective view of a liquid crystal device according to a first embodiment of the present invention.
Figure 2:
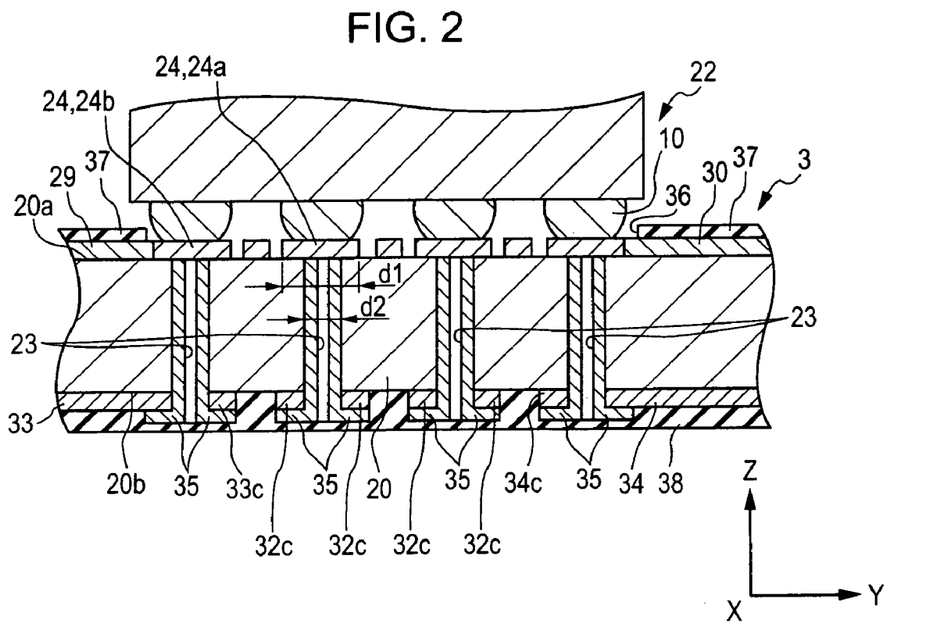
FIG. 2 is a cross-sectional view taken along Line II-II of a circuit board shown in FIG. 1.
Figure 3:
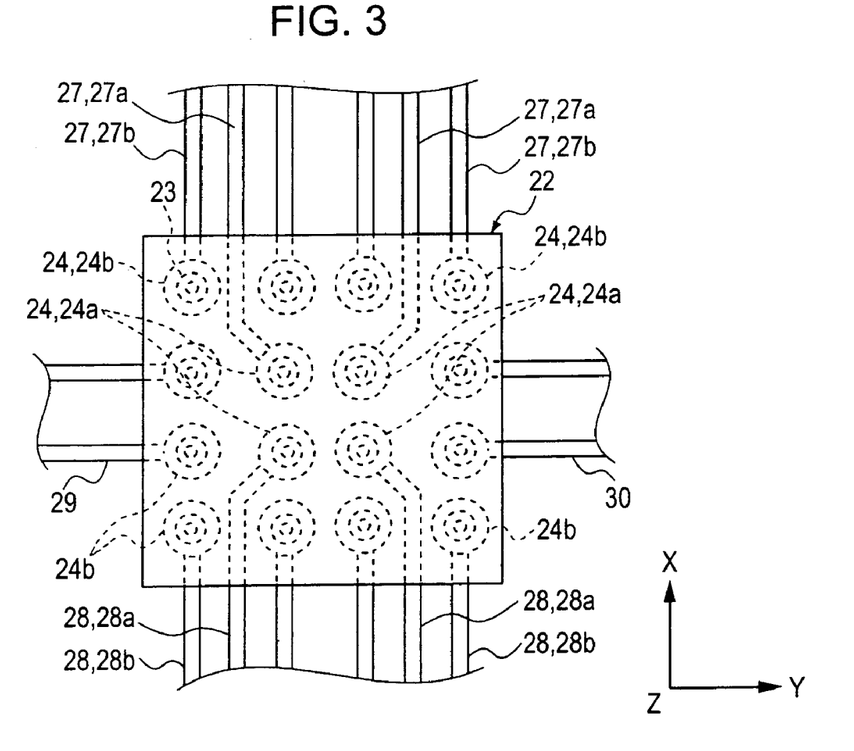
FIG. 3 is a plan view of a semiconductor element disposed on the circuit board of the liquid crystal device shown in FIG. 1.
Figure 4:
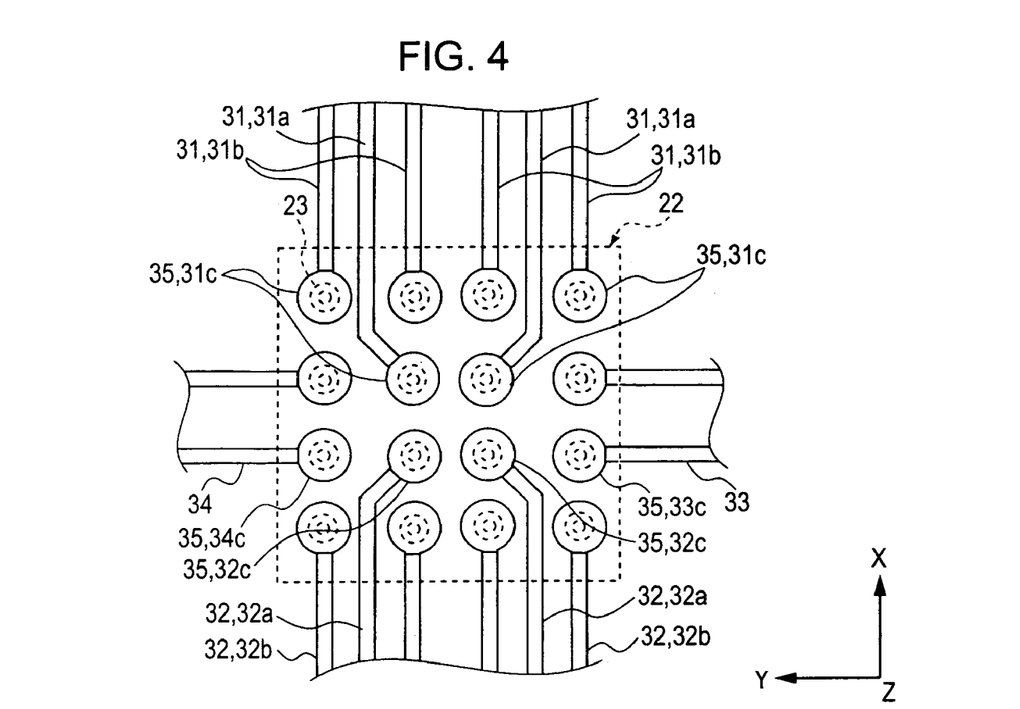
FIG. 4 is a bottom view of the circuit board of the liquid crystal device shown in FIG. 1, where the semiconductor elements disposed.

FIG. 1 is a schematic perspective view illustrating a liquid crystal device according to a first embodiment of the invention, FIG. 2 is a cross-sectional view taken along Line II-II of a circuit board shown in FIG. 1, FIG. 3 is a plan view of a semiconductor element mounted on the circuit board of the liquid crystal device shown in FIG. 1, and FIG. 4 is a partial bottom view of the circuit board on which the semiconductor element is disposed in the liquid crystal device shown in FIG. 1.

The circuit board according to the first embodiment is a substrate for an electro-optical device and is connected to the liquid crystal device.

Hereinafter, a TFT (Thin Film Transistor) active matrix liquid crystal device is described as an example of the liquid crystal device 1.

Configuration of Liquid Crystal Device

The liquid crystal device 1 includes a liquid crystal panel 2 and a circuit board 3 connected to the liquid crystal panel 2. The liquid crystal device 1 further includes additional members such as a frame (not shown) supporting the liquid crystal panel 2 as needed.

The liquid crystal panel 2 includes a substrate 4, a substrate 5 opposed to the substrate 4, a seal member 6 disposed between the substrates 4 and 5, and liquid crystal (not shown) enclosed between the substrates 4 and 5. For example, TN (Twisted Nematic) liquid crystal is used as the liquid crystal.

The substrates 4 and 5 are plate-shaped members made of a material having a light transmitting property such as glass and synthetic resin. Gate electrodes 7, source electrodes 8, thin film transistor elements T, and pixel electrodes 9 are formed on the inner surface (on the side of the liquid crystal) of the substrate 4 and a common electrode 5a is formed on the inner surface (on the side of the liquid crystal) of the substrate 5.

The gate electrodes 7 which extend in the X direction and the source electrodes 8 which extend in the Y direction are made of a metal material such as aluminum. The upper half of the source electrodes 8 are led out to left and the lower half thereof are led out to right, for example, as shown in FIG. 1. The number of the gate electrodes 7 and the number of the source electrodes 8 can be properly changed depending upon a resolution of the liquid crystal device 1 or a size of a display area.

Each thin film transistor element T has three terminals which are electrically connected to the corresponding gate electrode 7, the corresponding source electrode 8, and the corresponding pixel electrode 9, respectively. The thin film transistor element T is electrically connected to the pixel electrode 9, the gate electrode 7, and the source electrode 8. Accordingly, current can flow from the source electrode 8 to the pixel electrode 9 or in the opposite direction, when a voltage is applied to the gate electrode 7.

The substrate 4 has an area (hereinafter, referred to as "extension part") 4a extending from the outer edge of the substrate 5. Drive ICs 11, 12, and 13 for driving the liquid crystal are mounted on the surface of the extension part 4a. Wires 14, 15, and 16 are drawn out from connection terminals electrically connected to bumps (not shown) of the drive ICs 11, 12, and 13 through an anisotropic conductive film (ACF). The wires 14 are electrically connected to the gate electrodes 7 and the wires 15 and 16 are electrically connected to source electrodes 8, respectively. Wires 17, 18, and 19 are drawn out from input connection terminals (not shown) if the drive ICs 11, 12, and 13.

The circuit board 3 is connected to the extension part 4a with, for example, an adhesive therebetween as shown in FIG. 1. The circuit board 3 includes a flexible base member 20 having a first surface 20a and a second surface 20b opposite to the first surface 20a as shown in FIG. 2, and conductive portions 21 shown in FIG. 1 which includes wires 27 to be described later disposed on the first surface 20a of the flexible base member 20.

The flexible base member 20 are mounted with a semiconductor element 22 as an electronic component for controlling the drive IC 11 and the like or a semiconductor element not shown for a power supply. As shown in FIGS. 2, 3, and 4, hole portions 23 passing the flexible base member from the first surface 20a to the second surface 20b are formed, for example, in a lattice shape in the flexible base member 20.

As shown in FIGS. 2 and 3, the conductive portions 21 include terminals 24 to be described later which are disposed in a lattice shape on the first surface 20a of the flexible base member 20, wires 25 and 26 described later and shown in FIG. 1, wires 27 to 30 which are electrically connected to the terminals 24 and disposed on the first surface 20a as shown in FIG. 1 and described later, connection members 35 electrically connecting the terminals to the wires 27 to 30, and wires 31 to 34 disposed on the second surface 20b to correspond to the wires 27 to 30. As shown in FIG. 1, ends of the wires 25 and 26 are electrically connected to the wires 18 and 19 through the ACF and the other ends thereof are electrically connected to an external device (not shown).

The terminals 24, as shown in FIGS. 2 and 3, are disposed in a lattice shape so as to cover the hole portions 23 at the side of the first surface 20a of the flexible base member 20. That is, the lattice-shaped terminals 24 include terminals 24b disposed in a frame shape on the outer circumferential portion of the lattice shape and terminals 24a disposed inside the outer circumferential terminals 24b. The gap between neighboring terminals 24 is set to, for example, 0.5 mm. The hole portions 23 of the flexible base member 20 are formed right below the terminals 24, that is, at positions two-dimensionally overlapping with the terminals. The plan shape of the terminals 24 is, for example, circular as shown in FIG. 3. The hole portions 23 have a cylindrical shape and connection members 35 described later are disposed so as to overlap with the insides of the hole portions 23 and connection portions 32c described later. The terminals 24 are electrically connected to the connection members 35. The diameter d1 of the terminals 24 is set greater than the diameter d2 of the hole portions 23 so as to fully cover the hole portions 23 of the flexible base member 20. The terminals 24 are electrically connected to solder balls 10 as conductive terminals disposed on the bottom surface of the semiconductor element 22 and disposed in a lattice shape corresponding to the terminals 24, for example, through the use of thermal compression. Accordingly, the semiconductor element 22 is mounted on the flexible base member 20. Therefore, the hole portions 23 are disposed at the positions two-dimensionally overlapping with the terminals 24 and the solder balls 10 as the conductive terminals. As the conductive terminals of the semiconductor element 22, for example, gold bumps or aluminum bumps may be used, in addition to the solder balls.

Here, the lattice shape means that intersections of virtual straight lines or curved lines almost close to the straight lines, which connect a plurality of terminals 24 to each other, form a lattice shape. Accordingly, the plurality of terminals 24 are disposed at the intersections between the virtual straight lines or the curved lines almost close to the straight lines.

The wires 25 and 26 are disposed on the second surface 20b, for example, as shown in FIG. 1. Ends of the wires 25 and 26 are electrically connected to the wires 18 and 19 through the ACF as shown in FIG. 1 and the other ends of the wires 25 and 26 are electrically connected to an external device (not shown).

The wires 27 to 30 are disposed on the first surface 20a of the flexible base member 20. For example, six columns of the wires 27 and 28 are disposed in the Y direction as shown in FIG. 3 and for example, two rows of the wires 29 and 30 are disposed in the X direction. As shown in FIGS. 2 and 3, the ends of the wires 27 and the ends of the wires 28 to 30 are electrically connected to the terminals 24 disposed in the lattice shape.

Figure 12:
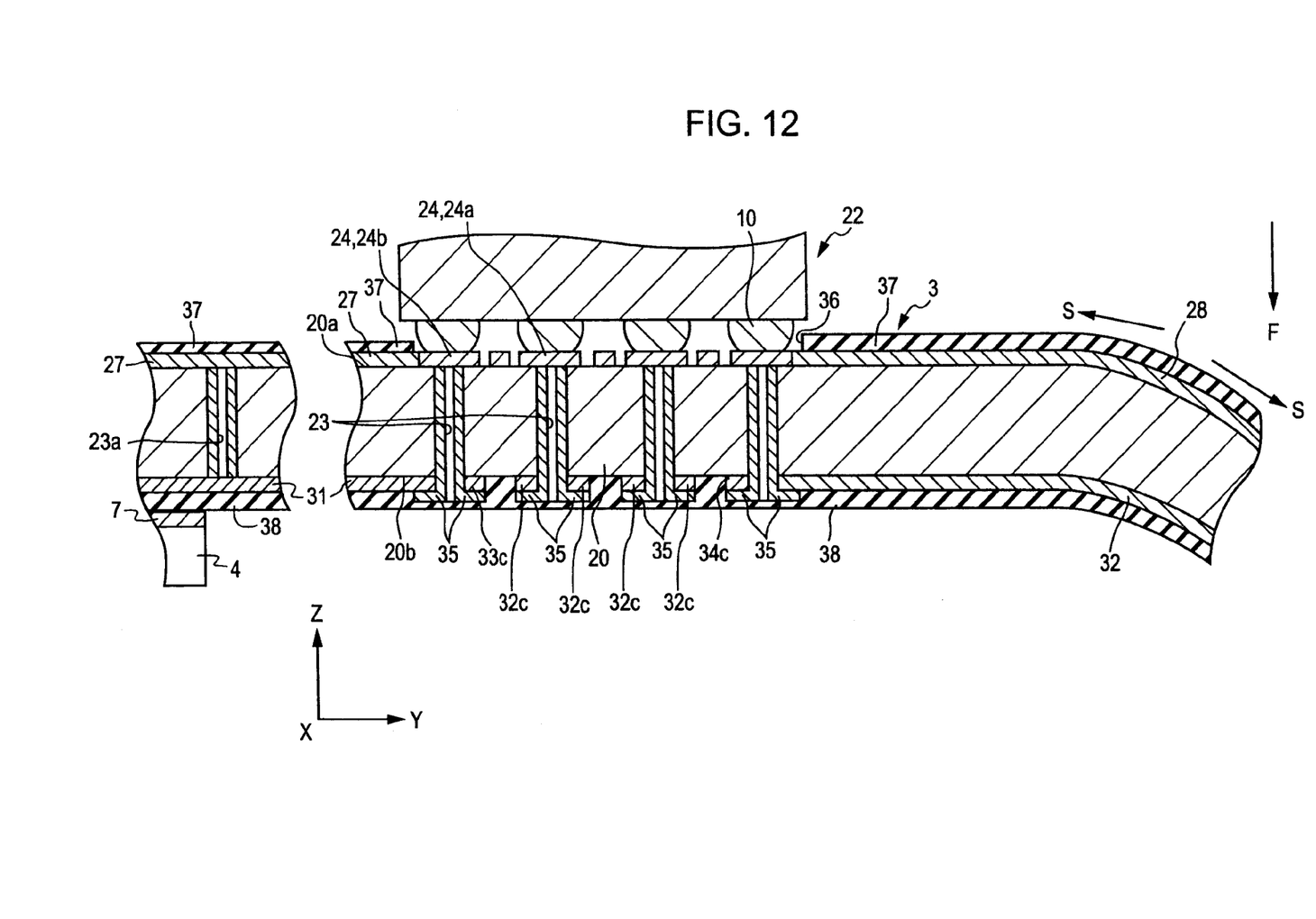
FIG. 12 is a cross-sectional view of the circuit board of the liquid crystal device according to the first embodiment when it is warped.

The other ends of the wires 27 are electrically connected to the wires 31 disposed on the second surface 20b as shown in FIG. 1 through the connection members disposed in hole portions 23a as shown in FIG. 12 having a structure similar to the hole portions 23. The wires 31 are electrically connected to the wires 17 through the ACF. The other ends of the wires 28 to 30 as shown in FIG. 1 are electrically connected to an external device (not shown). Wires 27a and 28a electrically connected to the terminals 24a through the connection members 35 are once drawn out in a direction oblique to the X direction and then drawn out at the outside of the outer circumferential terminals 24b in the X direction as shown in FIG. 3.

The wires 31 to 34 are disposed on the second surface 20b of the flexible base member 20 to correspond to the wires 27 to 30, respectively, as shown in FIG. 4. Specifically, as shown in FIG. 4, six columns of the wires 31 and 32 are disposed in the Y direction to correspond to the wires 27 and 28 and two rows of the wires 33 and 34 are disposed in the X direction to correspond to the wires 29 and 30. As shown in FIGS. 2 and 4, the connection portions 31c, 32c, 33c, and 34c disposed at ends of the wires 31 to 34 are disposed right below the terminals 24 to correspond to the terminals 24. The connection portions 31c, 32c, 33c, and 34c are electrically connected to the terminals 24 through the connection members 35 shown in FIG. 2, respectively. For example, as shown in FIG. 2, the connection portion 32c of the wire 32, the connection portion 33c of the wire 33, and the connection portion 34c of the wire 34 are electrically connected to the different connection members 35, respectively. The other ends of the wires 31 to 34 are drawn out to the outside of the semiconductor element 22. For example, the other end of the wire 31 is electrically connected to the wire 27 and is electrically connected to the wire 17 through the ACF or the like. Wires 31a and 32a electrically connected to the terminals 24a through the connection members 35 are once drawn out in a direction oblique to the X direction and then drawn out at the outside of the outer circumferential terminals 24b in the X direction as shown in FIG. 4.

The connection members 35 which are formed through plating are disposed in the hole portions 23 of the flexible base member 20 right below the terminals 24 in the Z direction from the first surface 20a to the second surface 20b, as shown in FIG. 2. That is, the connection members 35 are disposed in the hole portions 23 and on the connection portions 31c, 32c, 33c, and 34c of the wires 31 to 34. The connection members 35 almost covers the inner circumferential surfaces of the hole portions 23. The ends of the connection members 35 are electrically connected to the terminals 24 and the other ends thereof are electrically connected to the connection portions 31c, 32c, 33c, and 34c of the wires 31 to 34. The connection members 35 are made of, for example, copper. Accordingly, the terminals 24 on the first surface 20a and the wires 31 to 34 on the second surface 20b are electrically connected to each other through the connection members 35, respectively.

The first surface 20a of the flexible base member 20 is covered with, for example, an insulating film 37 made of resist in which openings 36 for exposing the terminals 24 as shown in FIG. 2.

The whole surface of the second surface 20b of the flexible base member 20 is covered with, for example, an insulating layer 38 made of polyimide covering the wires 31 to 34 and the connection members 35, as shown in FIG. 2. The insulating layer 38 is not shown in FIGS. 3 and 4.

Method of Manufacturing Liquid Crystal Device

Next, a method of manufacturing the liquid crystal device 1 will be described with reference to the drawings.

Figure 5:
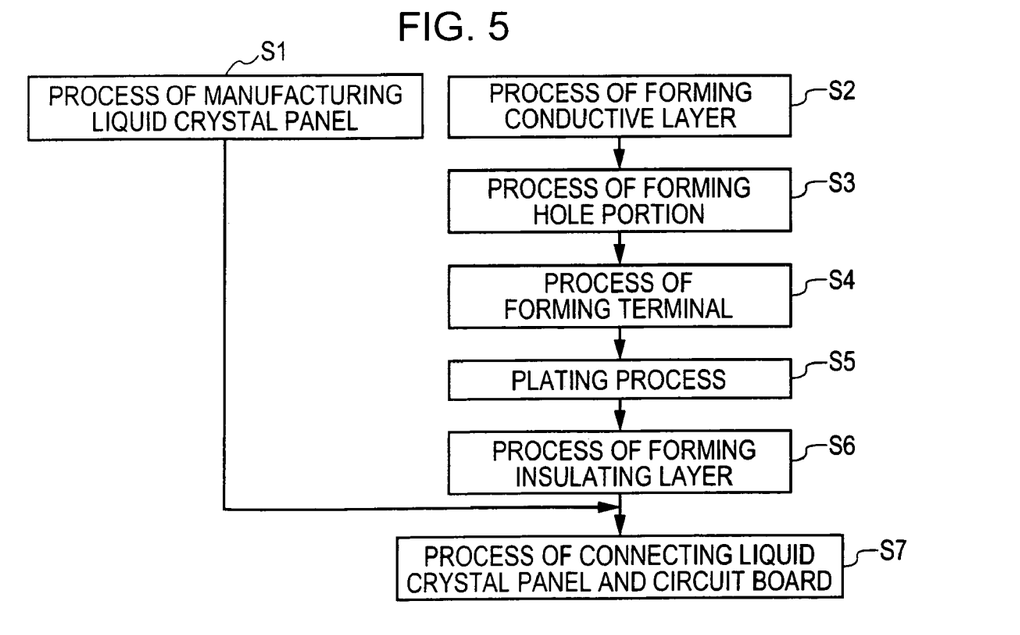
FIG. 5 is a flowchart illustrating a process of manufacturing the liquid crystal device according to the first embodiment.
Figure 6:
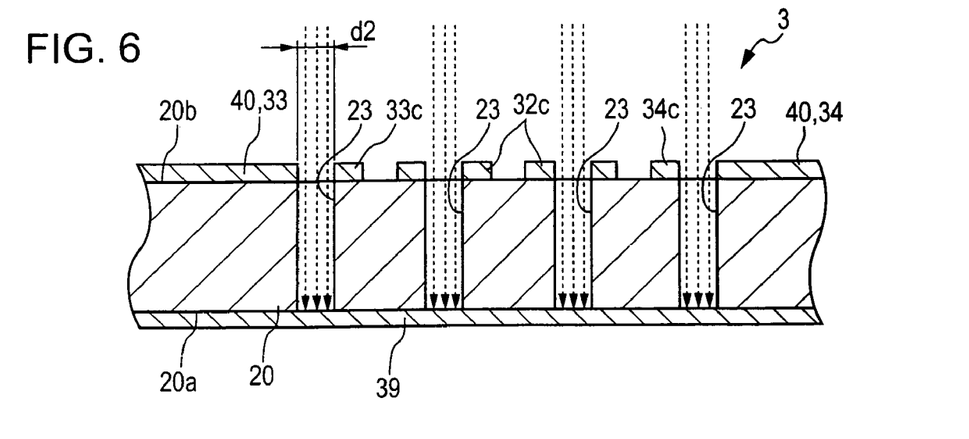
FIG. 6 is a cross-sectional view of the circuit board for explaining a process (S3) of forming hole portions in the board.
Figure 7:
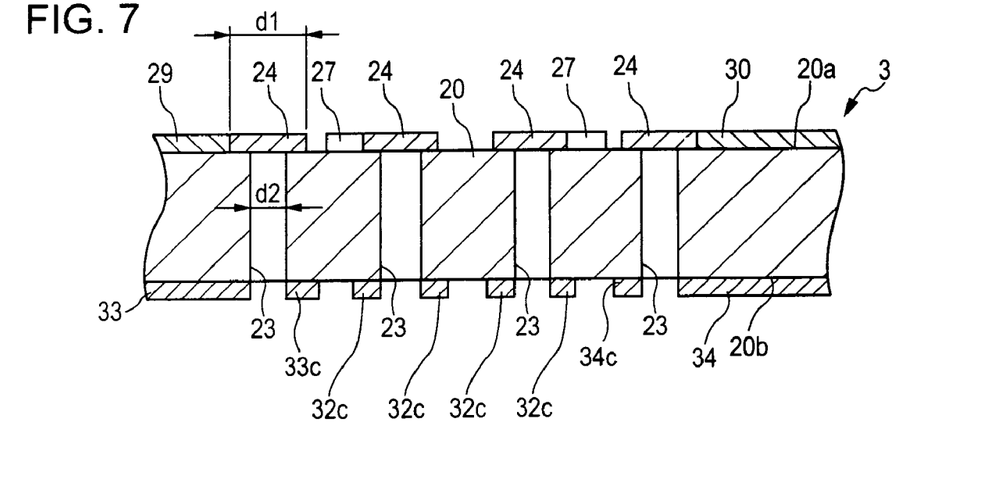
FIG. 7 is a cross-sectional view of the circuit board for explaining a process (S4) of forming terminals and wires.
Figure 8:
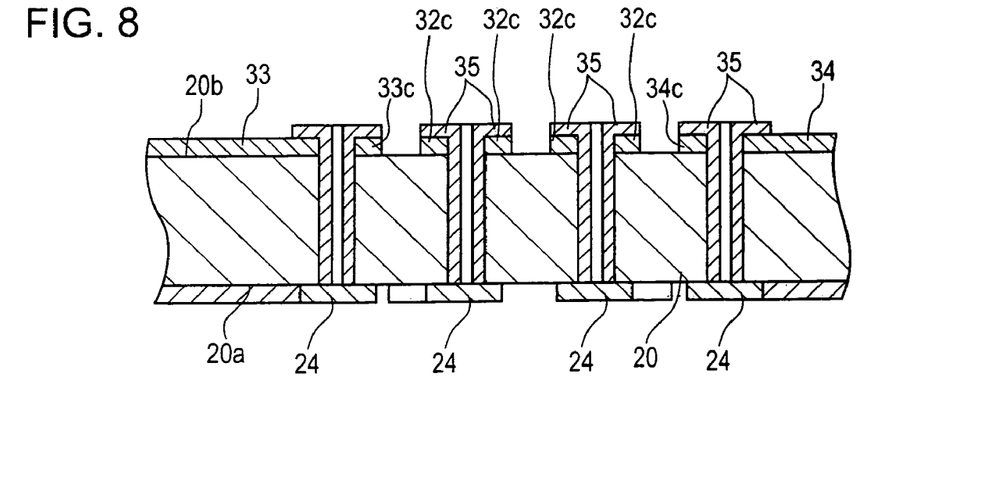
FIG. 8 is a cross-sectional view of the circuit board for explaining a plating process (S5).
Figure 9:
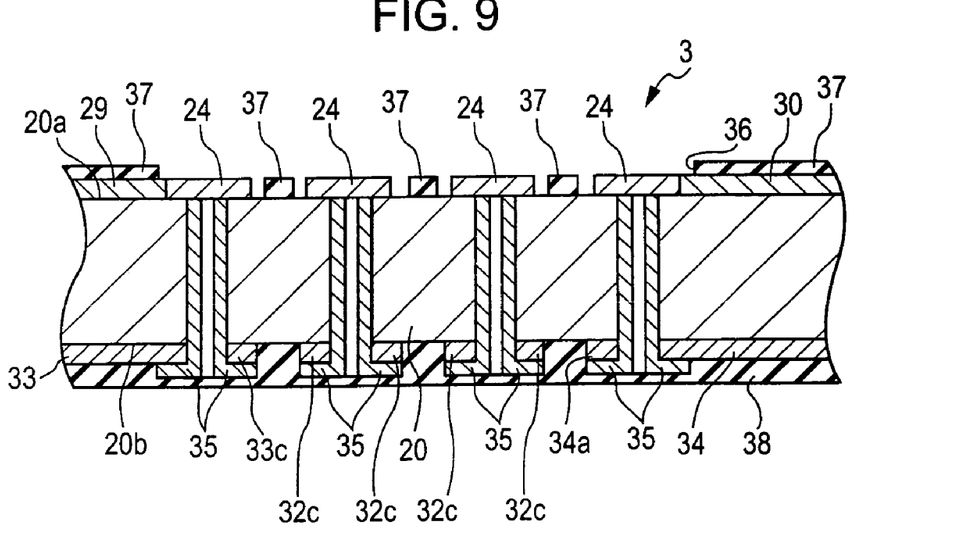
FIG. 9 is a cross-sectional view of the circuit board for explaining a process (S6) of forming an insulating layer.

FIG. 5 is a flowchart illustrating a process of manufacturing the liquid crystal device 1 according to the first embodiment, FIG. 6 is a cross-sectional view of the circuit board 3 for explaining a process of forming the hole portions 23 in the flexible base member 20, FIG. 7 is a cross-sectional view of the circuit board 3 for explaining a process of forming the terminals 24, FIG. 8 is a cross-sectional view of the circuit board 3 for explaining a plating process, and FIG. 9 is a cross-sectional view of the circuit board 3 for explaining a process of forming the insulating layers 37 and 38. In the fist embodiment, since the process (S1) of manufacturing the liquid crystal panel 2 is similar to the known techniques, description thereof will be omitted and the processes of manufacturing the circuit board 3 will be mainly described.

First, as shown in FIG. 6, a first conductive layer 39 and a second conductive layer 40 are formed on the first surface 20a and the second surface 20b of the flexible base member 20 (S2). Next, for example, laser beam is irradiated to the second surface 20b to form the hole portions 23 passing through the second conductive layer 40 and the flexible base member 20 in a lattice shape (S3). At this time, the hole portions 23 are formed such that the surface of the first conductive layer 39 facing the flexible base member 20 at the opposite side of the incident side of the laser beam is exposed and the first conductive layer 39 is left. That is, unlike through holes, the hole portions 23 have a concave shape. For example, the wires 31, 32, 33, and 34 having the connection portions 31c, 32c, 33c, and 34c are formed in the second conductive layer 40 on which the laser beam is incident through an etching process. The wires 31 to 34 may be formed before forming the hole portions 23.

Next, as shown in FIG. 7, by etching the first conductive layer 39 on the first surface 20a to leave the first conductive layer 39 at portions corresponding to the hole portions 23, the terminals 24 having a circular shape and covering the hole portions 23 are formed in a lattice shape and the wires 27 to 30 connected to the terminals 24 are formed (S4). At this time, the diameter d1 of the terminals 24 is greater than the diameter d2 of the circular hole portions 23. Accordingly, the hole portions 23 are disposed at positions two-dimensionally overlapping with the terminals 24.

Subsequently, as shown in FIG. 8, the connection members 35 electrically connecting the terminals to the wires 31 to 34 are formed in the hole portions 23 and on the connection portions 31c, 32c, 33c, and 34c through the use of plating (S5). The connection members 35 are exemplified to have a circular shape, but the hole portions 23 may be filled with copper which is a material of the connection members 35 through the use of plating. Accordingly, the wires 27 on the first surface 20a and the wires 31 on the second surface 20b are electrically connected to the same terminals 24. The wires 28 and 32 are electrically connected to the same terminals 24, the wires 29 and 33 are electrically connected to the same terminals 24, and the wires 30 and 34 are electrically connected to the same terminals 24.

Figure 10:
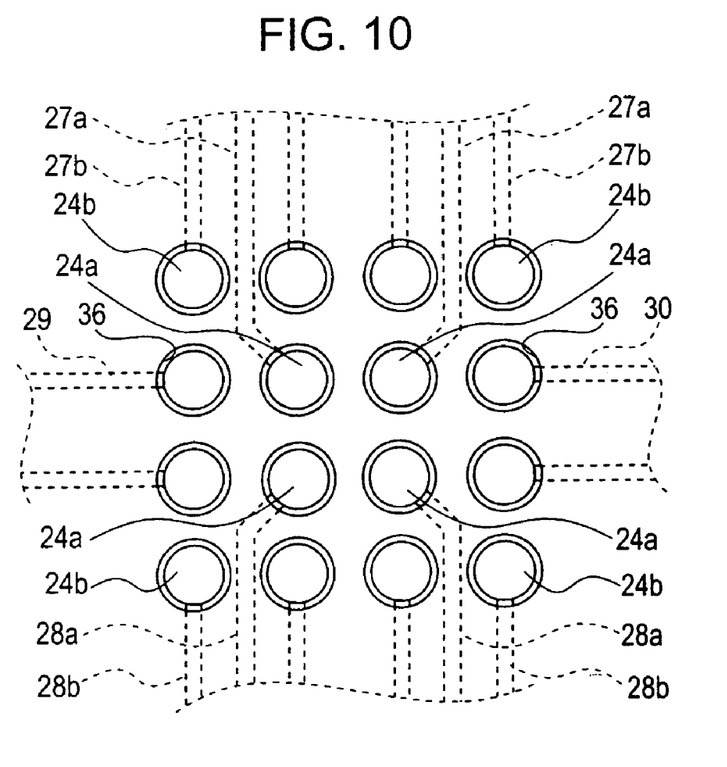
FIG. 10 is a plan view of the circuit board manufactured by the use of the method of manufacturing the liquid crystal device according to the first embodiment.
Figure 11:
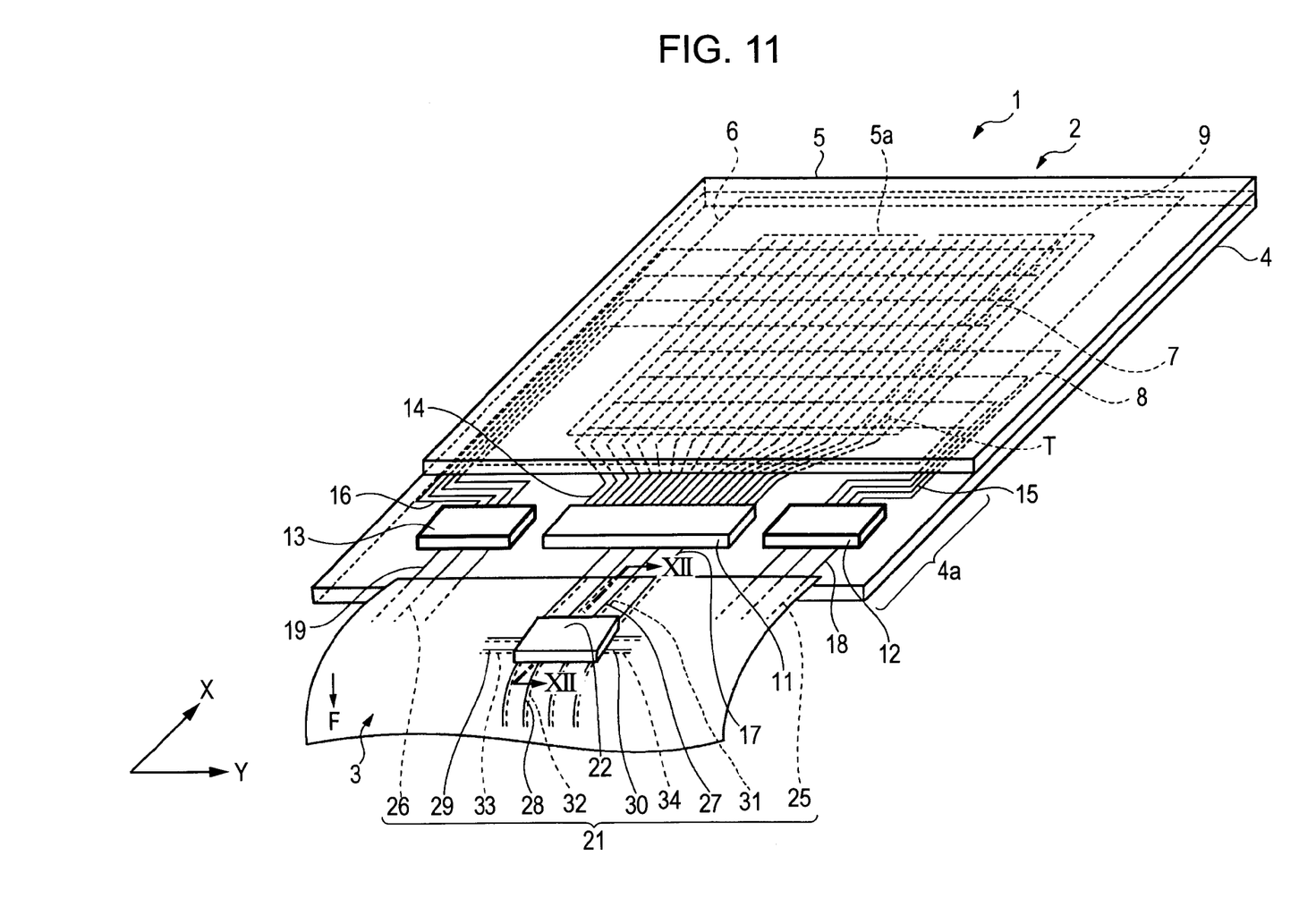
FIG. 11 is a schematic perspective view of the circuit board of the liquid crystal device according to the first embodiment when it is warped.

Next, the first surface 20a is covered with a resist to form the insulating layer 37. At this time, the openings 36 are formed in a lattice shape as shown in FIGS. 9 and 10 through the use of a photolithograph process, thereby exposing the terminals 24. Subsequently, the whole surface of the second surface 20b is covered with polyimide to form the insulating layer 38 as shown in FIG. 9 (S6).

Then, by bonding the liquid crystal panel 2 and the circuit board to each other with an adhesive, the liquid crystal device 1 is manufactured (S7).

According to the first embodiment described above, the circuit board 3 may be warped when an unintended force F acts on the vicinity of the electronic components of the circuit board 3, as shown in FIG. 12, for example, in an inspection process or the like. However, since the terminals 24 are disposed on the first surface 20a of the flexible base member 20, the wires 27 to 30 connected to the terminals 24 are disposed on the first surface 20a, the wires 31 to 34 connected to the terminals 24 through the connection members 35 disposed in the hole portions 23 formed in the flexible base member 20 to correspond to the terminals 24 are disposed on the second surface 20b opposite to the first surface 20a, the wires 34 at the curvature center side can maintain the connection to the terminals 24, thereby securing the electrical reliability of the wires 34, even when the tension S acts on the wires 30 opposite to the curvature center side of the flexible base member 20 and the wires 30 are disconnected as shown in FIG. 12.

In the past, in order to accomplish the electrical connection between the terminals on the first surface 20a of the flexible base member 20 and the wires on the second surface 20b, for example, through holes were formed at the positions of the flexible base member 20 other than the positions of the terminals 24. However, in the first embodiment, since the hole portions 23 are formed in the flexible base member 20 right below the terminals 24 and the terminals 24 and the wires 31 are electrically connected to each other through the connection members 35 disposed in the hole portions 23, useless spaces are unnecessary and it is thus possible to save mounting spaces.

In addition, since the wires 31 to 34 are covered with the insulating layer 38, the insulating property of the wires 31 to 34 can be secured.

Second Embodiment

Next, a liquid crystal device according to a second embodiment of the invention will be described. In embodiments and modified examples described below, the same elements as those of the first embodiment are denoted by the same reference numerals and descriptions thereof are omitted. Different elements are mainly described.

Figure 13:
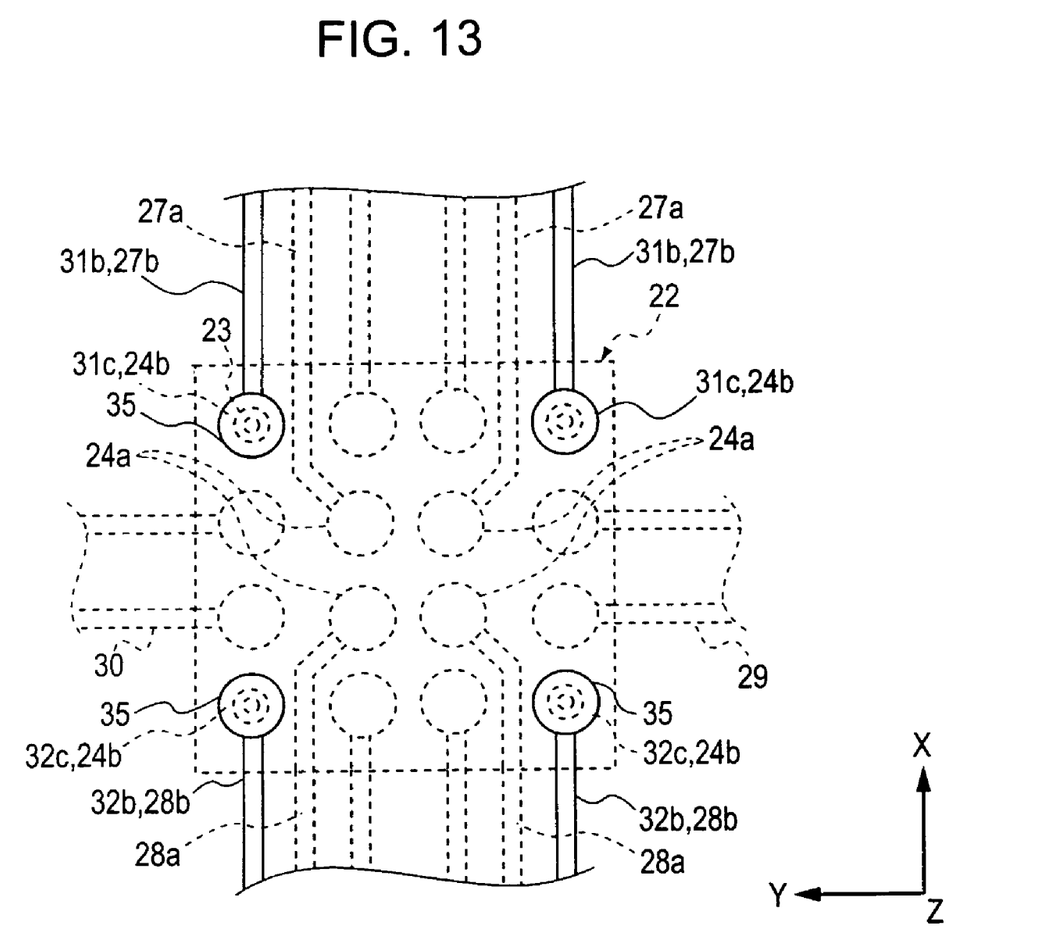
FIG. 13 is a bottom view of a circuit board of a liquid crystal device according to the second embodiment.
Figure 14:
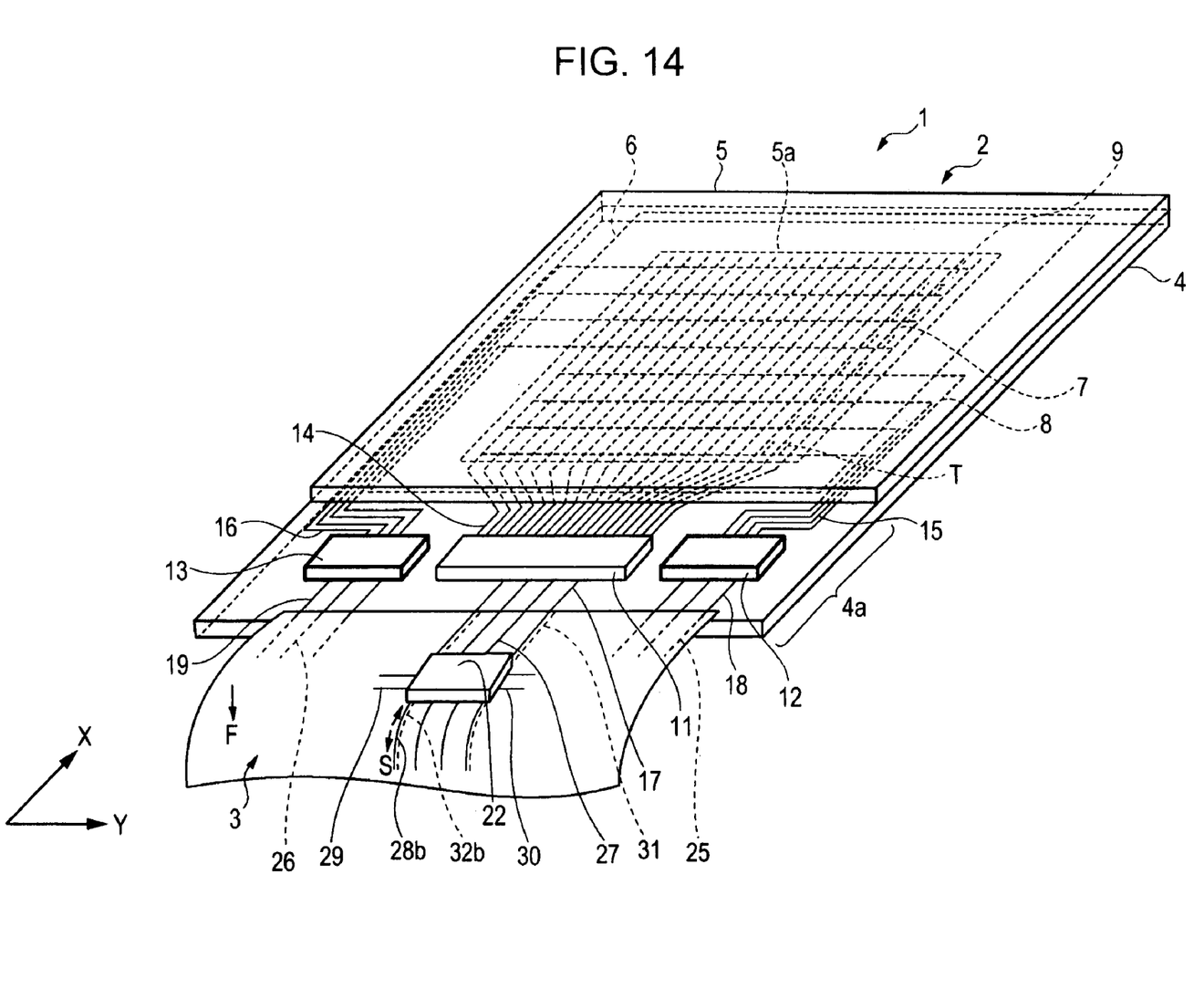
FIG. 14 is a schematic perspective view of the circuit board of the liquid crystal device according to the second embodiment when it is warped.

FIG. 13 is a bottom view of a circuit board of a liquid crystal device according to the second embodiment and FIG. 14 is a schematic perspective view of the circuit board of the liquid crystal device according to the second embodiment when it is warped. The insulating layer 38 is not shown in FIG. 13.

In the second embodiment, unlike the wires on the second surface 20b of the flexible base member 20 according to the first embodiment, wires 31b and 32b electrically connected to only corner terminals 24b among the lattice-shaped terminals 24 are disposed on the second surface 20b. That is, the wires electrically connected to the terminals 24a other than the corner terminals 24b among the lattice-shaped terminals 24 are not disposed on the second surface 20b. The hole portions 23 are formed only right below the corner terminals 24b among the lattice-shaped terminals 24 and the corner terminals 24b are electrically connected to the wires 31b and 32b through the connection members 35. The hole portions 23 are not formed right below the terminals 24a other than the corner terminals 24b among the lattice-shaped terminals 24. The wires 31b electrically connected to the connection portion 31c are disposed corresponding to the wires 27 on the first surface 20a. The wires 32b electrically connected to the connection portions 32c are disposed corresponding (opposed) to (along) the wires 28 on the first surface 20a.

According to the second embodiment described above, the wires 27b and the wires 31b are electrically connected to the terminals 24b disposed at the corners among the lattice-shaped terminals 24 and the wires 28b and 32b are electrically connected to the terminals 24b. Accordingly, when an external force F acts on the circuit board 3 as shown in FIG. 14 at the time of inspecting the circuit board 3, the circuit board 3 in the vicinity of the electronic components may be warped so as to elongate the wires 28b on the first surface 20a of the flexible base member 20 and the wires 27b connected to the corner terminals 24b may be disconnected, but the electrical connection can be secured by the use of the wires 31b even when the wires 27b are disconnected. In this way, the disconnection of the wires 32b connected to the corner terminals 24b in which the disconnection can easily occur due to the small number of wires 31b and 32b can be prevented, thereby securing the electrical reliability of the wires.

For example, since the wires 31b on the second surface 20b are disposed corresponding (opposed) to (along) the wires 27a on the first surface 20a through the flexible base member 20, it is possible to further save the wiring space in comparison with the case that the wires are not disposed correspondingly.

In addition, since only the wires 31b and 32b electrically connected to the corner terminals 24b of the lattice shape are disposed on the second surface 20b and the hole portions 23 are not formed right below the terminals other than the corner terminals 24b, it is possible to reduce cost for the solder materials or the wires.

First Modified Example

Figure 15:
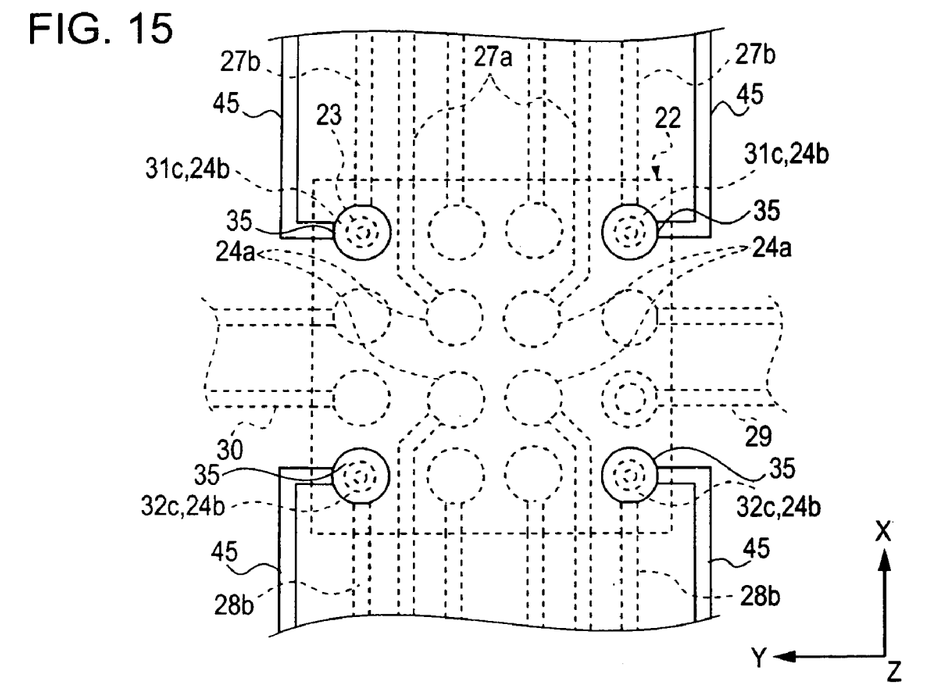
FIG. 15 is a bottom view of a circuit board of a liquid crystal device according to a first modified example of the invention.

FIG. 15 is a bottom view of a circuit board of a liquid crystal device according to a first modified example. In modified examples described below, the insulating layer 38 is not shown.

In the first modified example, unlike the wires on the second surface 20b of the flexible base member 20 according to the first embodiment, wires 45 electrically connected to only the corner terminals 24b among the lattice-shaped terminals 24 are disposed on the second surface 20b, and the wires 27b connected to the corner terminals 24b and the wires 45 electrically connected to the same terminals 24b have different drawing-out directions from the terminals 24b. For example, the wires 45 are drawn out in the Y direction perpendicular to the drawing-out direction of the wires 27b at the outside of the outline of the semiconductor element 22 and then are led out in the X direction to be approximately parallel to the wires 27b. The other ends of the wires 45 are electrically connected to the wires 27b on the first surface 20a through the connection members disposed in hole portions (not shown) having a structure similar to the hole portions 23 according to the first embodiment and are electrically connected to the wires 17 through the ACF. The wires electrically connected to the terminals 24a other than the corner terminals 24b among the lattice-shaped terminals 24 are not disposed on the second surface 20b. The hole portions 23 are formed only right below the corner terminals 24b among the lattice-shaped terminals 24 and the corner terminals 24b are electrically connected to the wires 45 through the connection members 35. The hole portions 23 are not formed right below the terminals 24a other than the corner terminals 24b among the lattice-shaped terminals 24.

According to the first modified example described above, the wires 45 electrically connected to only the corner terminals 24b among the lattice-shaped terminals 24 are disposed on the second surface 20b, and the wires 27b connected to the corner terminals 24b and the wires 45 electrically connected to the same terminals 24b have different drawing-out directions from the terminals 24b. That is, the wires 45 are drawn out in the Y direction perpendicular to the drawing-out direction of the wires 28b at the outside of the outline of the semiconductor element 22 and then are led out in the X direction to be approximately parallel to the wires 28b. For example, when the flexible base member 20 is warped in the vicinity of the wires 28b close to the electronic components and the flexible base member 20 is not warped in the vicinity of the wires 45 at the time of inspecting the flexible base member 20, the wires 28b may be easily disconnected. However, in the first modified example, the force acting on the wires 45 is smaller than the force acting on the wires 28b, thereby preventing the disconnection of the wires 45 and thus securing the electrical reliability of the wires 45.

Second Modified Example

Figure 16:
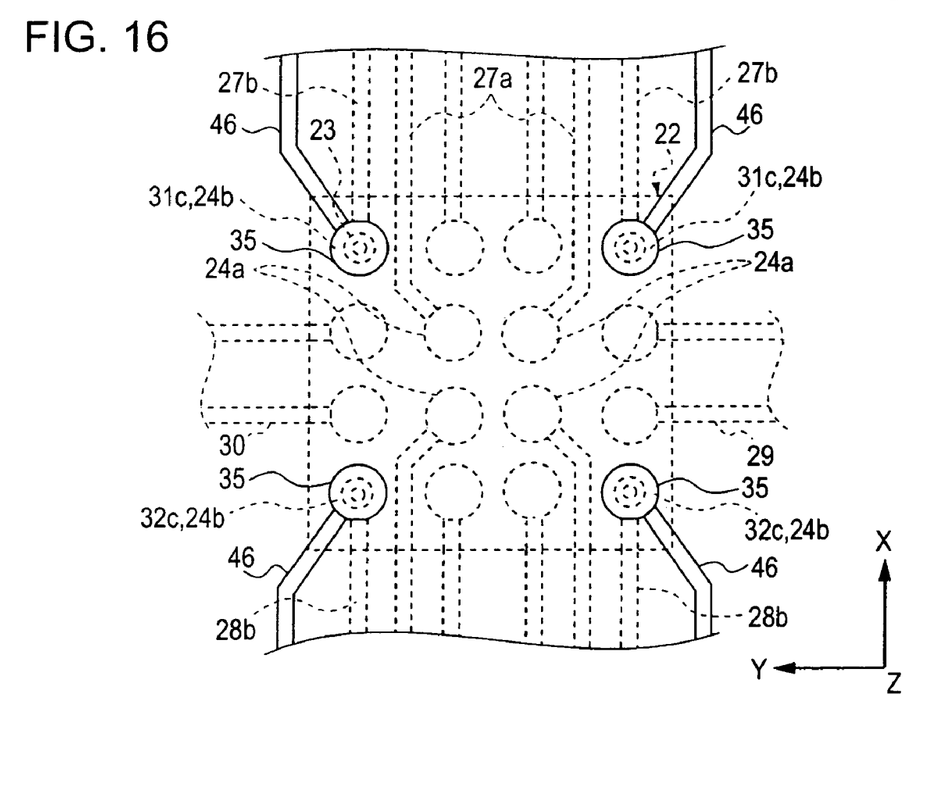
FIG. 16 is a bottom view of a circuit board of a liquid crystal device according to a second modified example.

FIG. 16 is a bottom view of a circuit board of a liquid crystal device according to a second modified example.

In the second modified example, unlike the wires on the second surface 20b of the flexible base member 20 according to the first embodiment, wires 46 electrically connected to only the corner terminals 24b among the lattice-shaped terminals 24 are disposed on the second surface 20b. The hole portions 23 are formed only right below the corner terminals 24b among the lattice-shaped terminals 24 and the corner terminals 24b are electrically connected to the wires 46 through the connection members 35. The ends of the wires 46 are connected to the terminals 24 through the connection members 35. The wires 46 are drawn out to the outside of the outline of the semiconductor element 22 such that the distance from the wires 27b and 28b becomes larger as they are more apart from the terminals 24 in the X direction and then are led out in the X direction to be approximately parallel to the wires 27b and 28b. The other ends of the wires 46 are electrically connected to the wires 27b and 28b on the first surface 20a through the connection members disposed in hole portions (not shown) having a structure similar to the hole portions 23 according to the first embodiment and the wires 46 drawn out to the liquid crystal panel 2 are connected to the wires 17 through the ACF.

According to the second modified example described above, the wires 46 electrically connected to only the corner terminals 24b among the lattice-shaped terminals 24 are disposed on the second surface 20b and the wires 27b connected to the terminals 24b and the wires 46 connected to the terminals 24b are different from each other in the drawing-out directions from the terminals 24b. That is, the wires 46 are drawn out to the outside of the outline of the semiconductor element 22 such that the distance from the wires 27b and 28b becomes larger as they are more apart from the terminals 24 in the X direction and then are led out in the X direction to be approximately parallel to the wires 27b and 28b. When the wires are lead out in the X direction or the Y direction as in the first modified example, the wiring space is increased in the Y direction. However, in the second modified example, it is possible to prevent the disconnection of the wires 46 while suppressing the wiring space and the length of the wires 46, thereby securing the electrical reliability of the wires 46 and enhancing the degree of freedom in wiring.

Third Modified Example

Figure 17:
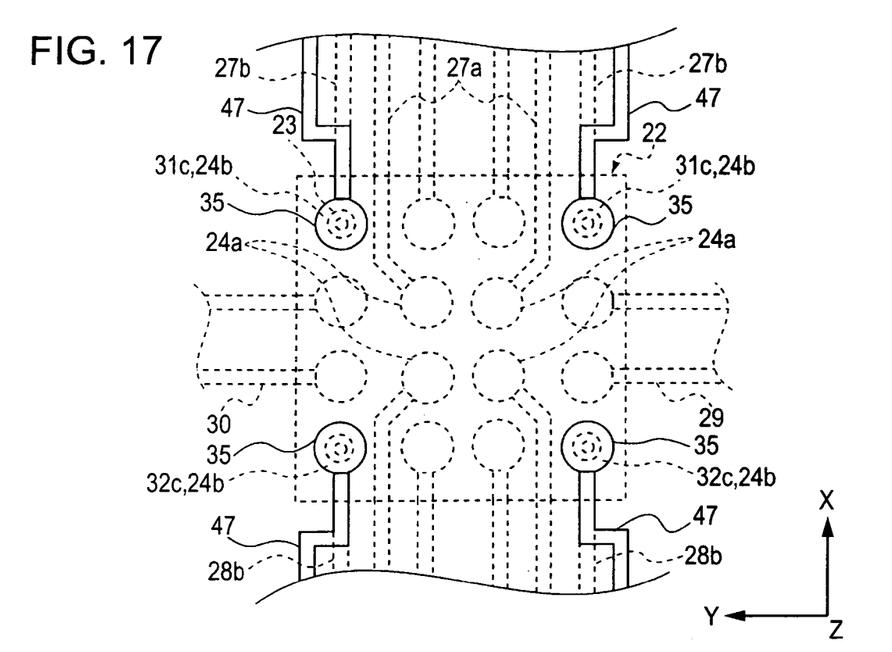
FIG. 17 is a bottom view of a circuit board of a liquid crystal device according to a third modified example.

FIG. 17 is a bottom view of a circuit board of a liquid crystal device according to a third modified example.

In the third modified example, unlike the wires on the second surface 20*b* of the flexible base member 20 according to the first embodiment, wires 47 electrically connected to only the corner terminals 24*b* among the lattice-shaped terminals 24 are disposed on the second surface 20*b*. The hole portions 23 are formed only right below the corner terminals 24*b* among the lattice-shaped terminals 24 and the corner terminals 24*b* are electrically connected to the wires 47 through the connection members 35. The wires 47 are drawn out to the outside of the outline of the semiconductor element 22 in a predetermined direction from the terminals 24, that is, in the X direction of FIG. 17, to be approximately parallel to the wires 27*b* and 28*b*, are bent in a predetermined direction, for example, in the Y direction of FIG. 17, and then are led out in the X direction of FIG. 17 to be approximately parallel to the wires 27*b* and 28*b*. The other ends of the wires 47 are electrically connected to the wires 27*b* and 28*b* on the first surface 20*a* through the connection members disposed in hole portions (not shown) having a structure similar to the hole portions 23 according to the first embodiment and the wires 47 drawn out to the liquid crystal panel 2 are connected to the wires 17 through the ACF.

According to the above-mentioned configuration, since the wires 27*b* connected to the terminals 24*b* and the wires 47 connected to the same terminals 24*b* are drawn out in the X direction, are drawn out in the Y direction, and then are led out in the X direction, the lengths of the wires 27*b* and the wires 47 can be set to the minimum lengths by drawing out the wires 27*b* and the wires 47 in the same direction X. In addition, since the wires 27*b* and the wires 47 are led in the different directions at the portions of the flexible base member 20 which can be easily bent, the force acting on the wires 47 is smaller than the force acting on the wires 27*b* when the flexible base member 20 is bent in the vicinity of the wires 27*b* close to the electronic component and the flexible base member 20 is not bent in the vicinity of the wires 47, thereby preventing the disconnection of the wires 47 and securing the reliability of the wires 47.

Third Embodiment

Electronic Apparatus

Next, an electronic apparatus according to a third embodiment of the invention having the liquid crystal device 1 will be described.

Figure 18:
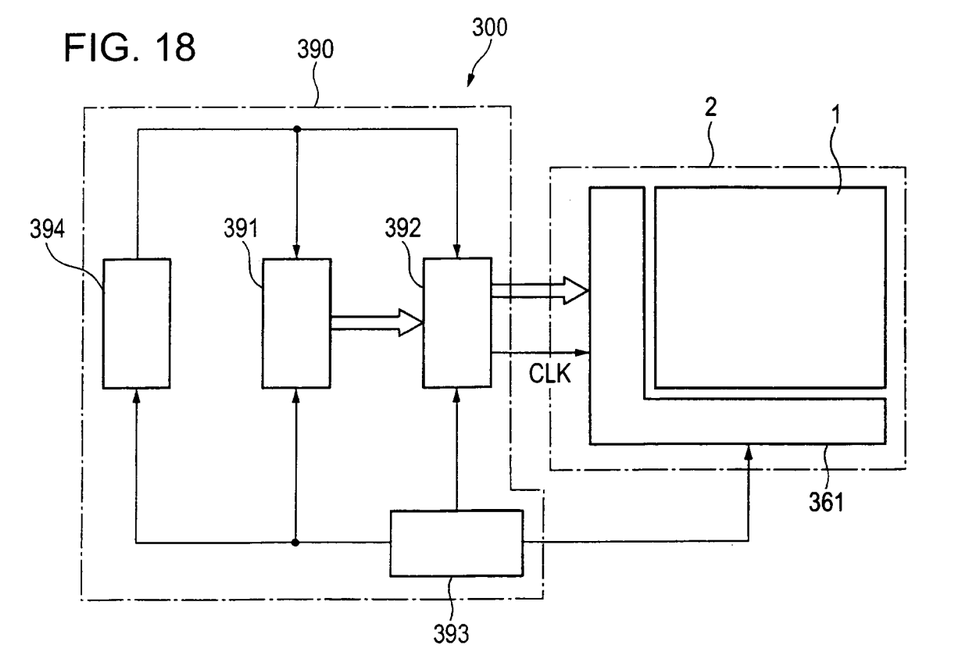
FIG. 18 is a diagram schematically illustrating a configuration of a display control system in an electronic apparatus according to a third embodiment of the invention.

FIG. 18 is a schematic diagram illustrating an entire configuration of a display control system in the electronic apparatus according to the third embodiment of the invention.

The electronic apparatus 300 has the liquid crystal panel 2 and a display control circuit 390 as the display control system as shown in FIG. 18. The display control circuit 390 includes a display information output source 391, a display information processing circuit 392, a power supply circuit 393, and a timing generator 394.

The liquid crystal panel 2 has a driving circuit 362 including the drive IC 11 for driving a display area I.

The display information output source 391 includes a memory composed of ROM (Read Only Memory) or RAM (Random Access Memory), a storage unit composed of a magnetic recording disk or an optical recording disk, and a tuning circuit outputting tuned digital image signals. The display information output source 391 is designed to supply the display information in the form of a predetermined format of image signals to the display information processing circuit 392 in accordance with various clock signals generated from the timing generator 394.

The display information processing circuit 392 includes various well-known circuits such as a serial-parallel conversion circuit, an amplification/inversion circuit, a rotation circuit, a gamma correction circuit, and a clamp circuit, processes the input display information, and supplies the image information to the driving circuit 361 together with the clock signals CLK. The power supply circuit 393 supplies a predetermined voltage to the respective elements.

According to the third embodiment, since the liquid crystal device 1 having excellent reliability of wires is provided, it is possible to obtain an electronic apparatus with an excellent display performance.

Specific examples of the electronic apparatus can include a touch panel mounted with the liquid crystal device, a projector, a liquid crystal television, a view finder type or monitor direct-view type video tape recorder, a car navigation apparatus, a pager, an electronic pocketbook, an electronic calculator, a word processor, a work station, a television phone, and a POS terminal, in addition to the mobile phone and the personal computer. The liquid crystal device 1 described above can be employed as the display unit of such various electronic apparatuses.

Hitherto, the present invention has been described with reference to the exemplary embodiments and the modified examples, but the invention is not limited to the above-mentioned embodiments and modified examples. The embodiments and modified examples may be properly changed and combined without departing from the technical spirit of the invention.

The TFT liquid crystal device 1 has been described in the first embodiment and the like, but the invention is not limited to it. The invention may apply to, for example, a TFD (Thin Film Diode) active matrix liquid crystal device or a passive matrix liquid crystal device. The invention is not limited to the transflective type, but may apply to a reflective type and a transmissive type. In addition, the invention may apply to various electro-optical devices such as a plasma display device, an electrophoresis display device, and a device employing electron emitting elements (Field Emission Display, Surface-Conduction Electron-Emitter Display, and the like).

In the above-mentioned embodiments and modified examples, it has been exemplified that the wires 27 to 30 of the circuit board 3 are led out by six columns in the Y direction and by two rows in the X direction. However, the wires connected to the terminals 24*a* may be drawn out in the Y direction between the terminals 24 adjacent to each other in the X direction and may be drawn out by four rows in the X direction and by four columns in the Y direction. In addition, it has been exemplified that sixteen terminals 24 are arranged four rows by four columns, but the number of terminal is not limited to the example.

In the above-described embodiments and modified examples, it has been exemplified that the plating process (S5) is performed after the process (S4) of forming the terminals 24 as shown in FIG. 5, but the invention is not limited to the example. For example, the process (S4) of forming the terminals 24 may be performed after the plating process (S5).

In the above-described embodiments and modified examples, it has been exemplified that the invention applies to the flexible base member 20 of which both surfaces are provided with the first conductive layer 39 and the second conductive layer 40, but the invention is not limited to the example. For example, the invention may apply to a flexible base member in which a conductive layer is interposed in the base member.

The entire disclosure of Japanese Patent Application No. 2005-015449, filed Jan. 1, 24, 2005, is expressly incorporated by reference herein.

What is claimed is:

1. An electro-optical device comprising:

an electro-optical panel;

a flexible base member connected to the electro-optical panel, the flexible base member including first and second hole portions at positions separated from each other;

a terminal on one surface of the flexible base member;

a first wire disposed on the one surface of the flexible base member and connected to the terminal;

first and second connection members disposed in the first and second hole portions, respectively, in the flexible base member;

a second wire disposed on an other surface of the flexible base member opposite to the one surface of the flexible base member, the second wire being connected to the terminal through the first connection member and being connected to the first wire through the second connection member; and an electronic component mounted on the flexible base member, the electronic component having a conductive terminal electrically connected to the terminal on the flexible base member, the conductive terminal of the electronic component two-dimensionally overlapping with the terminal on the flexible base member and also the first connection member in the flexible base member.

2. The electro-optical device according to claim 1, wherein the conductive terminals of the electronic component are solder balls.

3. The electro-optical device according to claim 1, further comprising a plurality of terminals disposed in a lattice shape on the flexible base member and the terminal on the flexible base member is disposed at a corner of the lattice shape.

* * * * *